United States Patent
Vogt (10) Patent No.: US 9,841,920 B2
(45) Date of Patent: Dec. 12, 2017

(54) HETEROGENEOUS MEMORY DIE STACKING FOR ENERGY EFFICIENT COMPUTING

(75) Inventor: Pete D. Vogt, Boulder, CO (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/997,241

(22) PCT Filed: Dec. 29, 2011

(86) PCT No.: PCT/US2011/067797
§ 371 (c)(1),
(2), (4) Date: May 23, 2014

(87) PCT Pub. No.: WO2013/101038
PCT Pub. Date: Jul. 4, 2013

(65) Prior Publication Data
US 2014/0310490 A1    Oct. 16, 2014

(51) Int. Cl.
*G06F 13/38*    (2006.01)
*G06F 3/06*    (2006.01)
*G11C 5/02*    (2006.01)
*G11C 5/06*    (2006.01)

(52) U.S. Cl.
CPC .......... *G06F 3/0647* (2013.01); *G06F 3/0604* (2013.01); *G06F 3/0683* (2013.01); *G11C 5/025* (2013.01); *G11C 5/063* (2013.01); *G06F 2003/0697* (2013.01)

(58) Field of Classification Search
None
See application file for complete search history.

(56) References Cited

U.S. PATENT DOCUMENTS

| 5,752,268 A | * | 5/1998 | Shimizu et al. | 711/162 |
| 2008/0157350 A1 | * | 7/2008 | Cheah et al. | 257/713 |
| 2008/0270811 A1 | * | 10/2008 | Chow et al. | 713/323 |
| 2009/0125687 A1 | | 5/2009 | Park et al. | |

(Continued)

FOREIGN PATENT DOCUMENTS

| CN | 101122865 B | 7/2010 |
| CN | 101923447 A | 12/2010 |

(Continued)

OTHER PUBLICATIONS

Office Action received for Taiwan Patent Application No. 101149783, dated Oct. 7, 2014, 11 pages of English Translation and 10 pages of Office Action.

(Continued)

*Primary Examiner* — Ilwoo Park
(74) *Attorney, Agent, or Firm* — Alpine Technology Law Group LLC (57) ABSTRACT

Methods and apparatus to provide heterogeneous memory die stacking for energy efficient computing are described. In one embodiment, a Phase Change Memory with Switch (PCMS) die is coupled to a Dynamic Random Access Memory (DRAM) die and a Central Processing Unit (CPU) die. CPU checkpointing state data is stored in the PCMS die first before transferring the checkpointing data to a backup media at a later and more extended time. Other embodiments are also disclosed and claimed.

27 Claims, 5 Drawing Sheets

(56) References Cited

U.S. PATENT DOCUMENTS

| | | | |
|---|---|---|---|
| 2009/0240899 A1* | 9/2009 | Akagawa | G06F 11/1464 711/154 |
| 2010/0122199 A1* | 5/2010 | Darrington et al. | 715/771 |
| 2010/0318718 A1 | 12/2010 | Eilert et al. | |
| 2010/0332859 A1 | 12/2010 | Trantham | |
| 2011/0113208 A1 | 5/2011 | Jouppi et al. | |
| 2011/0173488 A1* | 7/2011 | Blumrich | G06F 11/1438 714/4.1 |
| 2011/0246828 A1* | 10/2011 | Monchiero et al. | 714/31 |
| 2011/0307653 A1 | 12/2011 | Rudelic et al. | |
| 2011/0309475 A1 | 12/2011 | Lee | |
| 2012/0017065 A1 | 1/2012 | Muralimanohar | |
| 2012/0250443 A1* | 10/2012 | Saraswat et al. | 365/226 |
| 2013/0013563 A1* | 1/2013 | Prahlad | G06F 3/0607 707/639 |
| 2016/0239228 A1* | 8/2016 | Bennett | G06F 12/00 |

FOREIGN PATENT DOCUMENTS

| | | |
|---|---|---|
| CN | 102279817 A | 12/2011 |
| TW | 200842887 A | 11/2008 |
| TW | 201120901 A | 6/2011 |
| WO | 2011/059448 A1 | 5/2011 |
| WO | 2013/101038 A1 | 7/2013 |

OTHER PUBLICATIONS

Intel and Numonyx Achieve Research Milestone with Stacked, Cross Point Phase Change Memory Technology, New Research Discovery Paves Way for Scalable, Higher Density Phase Change Memory Produces, Santa Clara, CA, and Geneva, Oct. 28, 2009, 2 pages.

Notice of Allowance received for Taiwanese Patent Application No. 101149783 dated Feb. 13, 2015.

International Preliminary Report on Patentability and Written Opinion received for PCT Patent Application No. PCT/US20111067797, dated Jul. 10, 2014, 5 pages.

International Search Report and Written Opinion received for PCT Application No. PCT/US2011/067797, dated Sep. 5, 2012, 8 pages.

Dong et al., "Leverage 3D PCRAM Technologies to Reduce Checkpoint Overhead for future Exascale Systems", Proceedings of the Conference on High Performance Computing Networking, Storage and Analysis, Nov. 14-20, 2009, 12 pages.

Office Action and Search Report received for Chinese Patent Application No. 201180076050.2, dated Feb. 1, 2016, 33 pages including 22 pages of English translation.

Office Action received for Chinese Patent Application No. 201180076050.2, dated Sep. 26, 2016, 20 pages including 12 pages of English translation.

Office Action received for Chinese Patent Application No. 201180076050.2, dated Mar. 20, 2017, 18 pages including 11 pages of English translation.

Office Action received for Chinese Patent Application No. 201180076050.2 dated Aug. 15, 2017, 7 pages including 4 pages of English translation.

* cited by examiner

HETEROGENEOUS MEMORY DIE STACKING FOR ENERGY EFFICIENT COMPUTING

FIELD

The present disclosure generally relates to the field of electronics. More particularly, some embodiments of the invention generally relate to provision of heterogeneous memory die stacking for energy efficient computing.

BACKGROUND

To improve performance, Exascale computing interconnects hundreds of thousands of CPUs (Central Processing Units) to deliver an Exaflop level of performance. During a 24 hour simulation (such as weather forecasting) several of the CPUs are likely to fail. A checkpointing technique is typically used to periodically save an image of a problem data set so that when a failure occurs the machine may back up to the last saved copy of the data set and continue computing from that point. In this way, a problem may complete even though many failures might occur each day. The more often the data set is check pointed the less time is lost when the machine needs to back up to the checkpoint. The time it takes to save the data set in an Exascale system to a backup media may however consume a significant portion of the time the machine is operating thus reducing performance.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

In some embodiments, low-power and/or high-bandwidth techniques are provided to allow for checkpointing of state data (e.g., in an Exascale computer system or other types of computing systems including for example mobile computing devices such as smart phones, tablets, portable game consoles, etc.). As discussed herein, checkpointing generally refers to a technique where data regarding the state of a problem or program is saved periodically to provide fault tolerance. Upon occurrence of a failure, the most recently stored state data may be restored to enable recovery from a failure and continue working on the problem without having to start from the beginning. As discussed above, checkpointing in current machines is a time consuming process that reduces the performance of the system and may use hard disk drives to store large volumes of data over a significantly long period of time.

In an embodiment, a snapshot of the state data set may be saved during a relatively shorter first time period (e.g., less than 10 seconds) and then (e.g., gradually) copied to a backup media over an extended second time period. Hence, the second period may be much longer than the first period. Moreover, while the snapshot is being copied, the machine (e.g., CPU) may continue to execute instructions and work on problem(s). These techniques may reduce the performance lost for memory checkpointing to a relatively negligible amount.

An embodiment of the invention may also be used in handheld computing devices to deliver high bandwidth memory at significantly reduced power. For example, a heterogeneous stack of DRAM (Dynamic Random Access Memory) and non-volatile memory such as PCMS (Phase Change Memory with Switch) die may be used to implement an integrated Two-Level Memory (2LM) system. Accordingly, techniques discussed herein may be applied to a range of computing devices, from handhelds to Exascale HPC (High Performance Computing) to provide a high-bandwidth and/or low-power heterogeneous memory hierarchy consisting of DRAM and PCMS devices.

Figure 1:
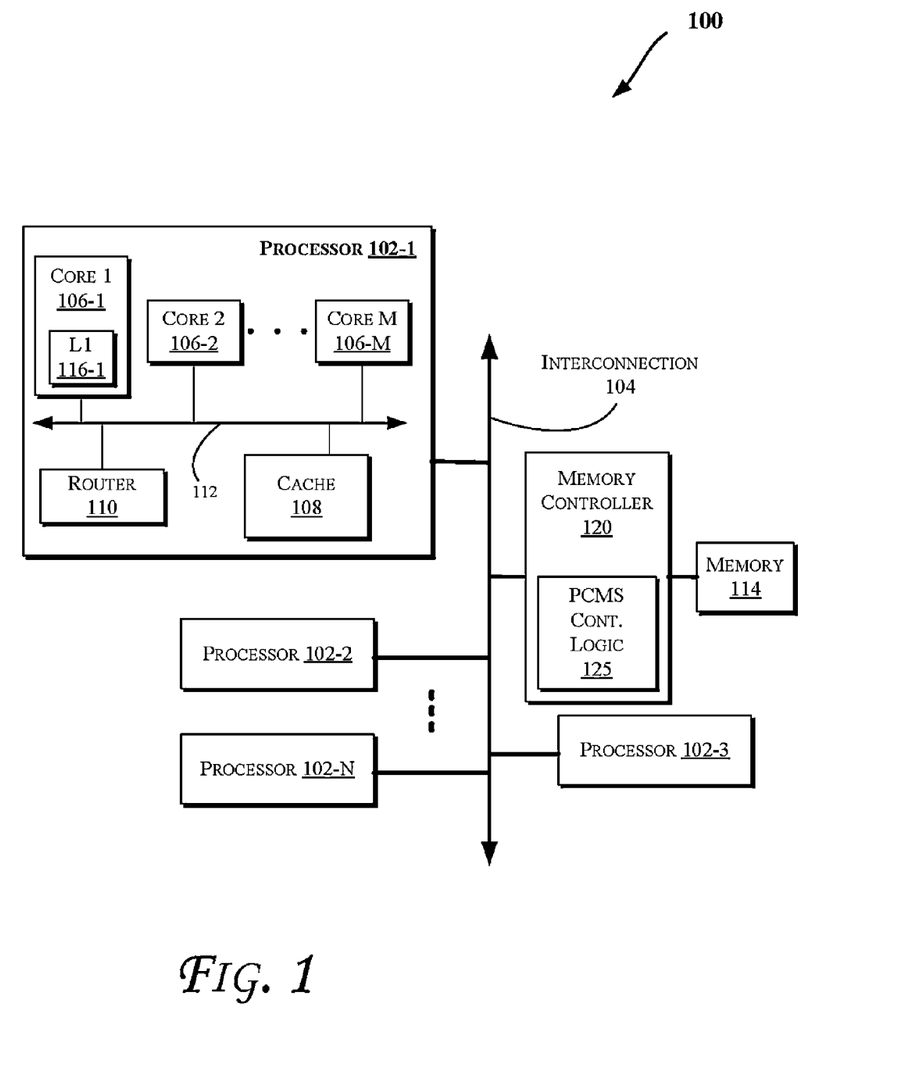
FIGS. 1, 4, and 5 illustrate block diagrams of embodiments of computing systems, which may be utilized to implement various embodiments discussed herein.

Moreover, the memory techniques discussed herein may be provided in various computing systems, such as those discussed with reference to FIGS. 1-5. More particularly, FIG. 1 illustrates a block diagram of a computing system 100, according to an embodiment of the invention. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers (such as those discussed with reference to FIGS. 4-5), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory 114 for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory 114 may be coupled to other components of system 100 through a memory controller 120. Memory 114 may include non-volatile memory such as PCMS memory in some embodiments. Even though the memory controller 120 is shown to be coupled between the interconnection 102 and the memory 114, the memory controller 120 may be located elsewhere in system 100. For example, memory controller 120 or portions of it may be provided within one of the processors 102 in some embodiments. Also, in some embodiments, system 100 may include logic (e.g., PCMS controller logic 125) to issue read or write requests to the memory 114 in an optimal fashion.

Figure 2:
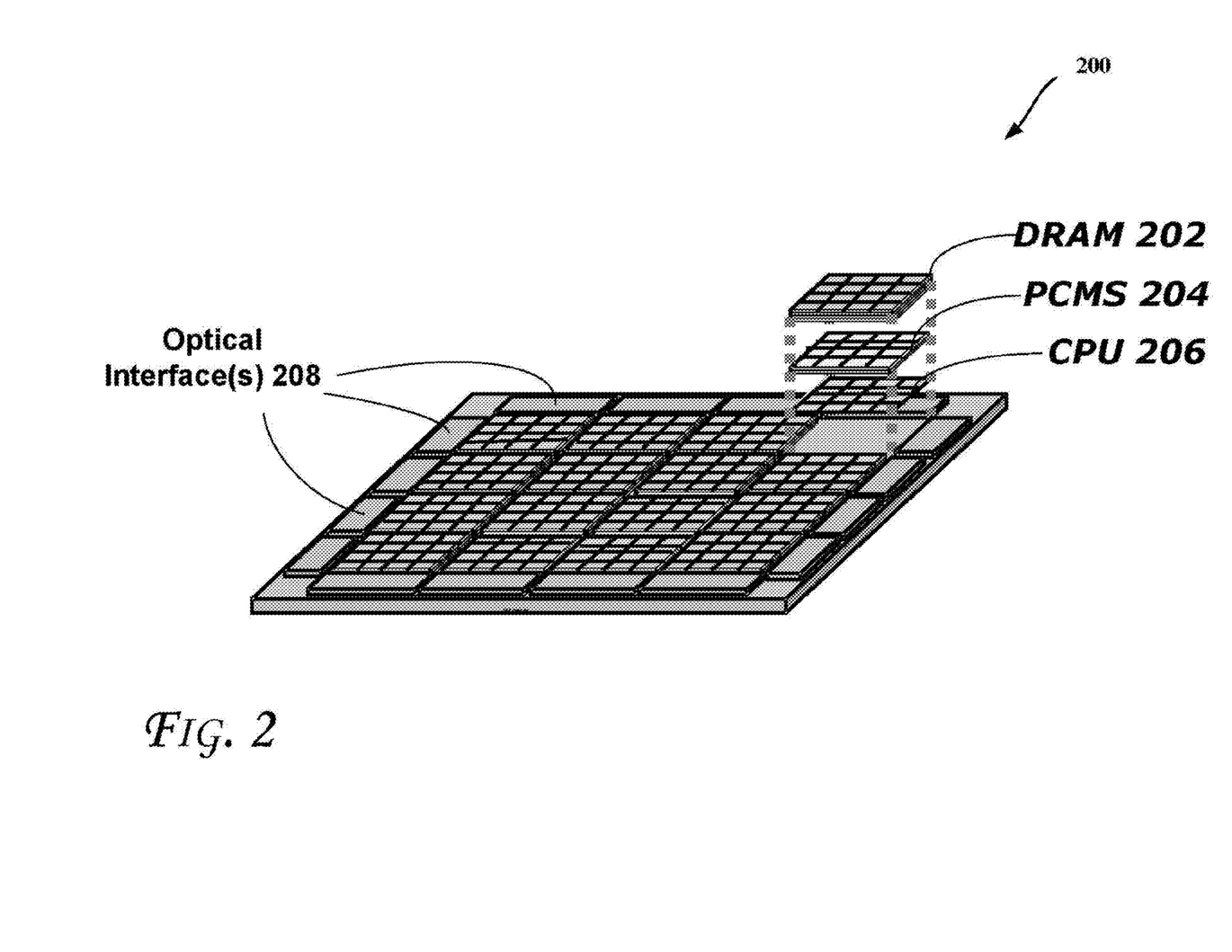
FIG. 2 illustrates a perspective view of an integrated circuit die assembly, according to an embodiment.

FIG. 2 illustrates a perspective view of an integrated circuit die assembly 200, according to an embodiment. As shown, the die assembly 200 may include a DRAM die 202 stacked on top of a PCMS die 204 which is stacked on top of a CPU die 206. The DRAM and CPU may be the same as or similar to the DRAM and CPU/processor discussed herein, e.g., with reference to FIG. 1 or 4-5. The die assembly 200 may also include interface(s) 208 (which may be optical in an embodiment) to facilitate communication with other components of a computing system (such as those discussed with reference to FIG. 1 or 4-5). Other types of interfaces/interconnects may also be used as discussed herein. Also, more than one DRAM die, PCMS die, and/or CPU die may be present on the die assembly 200 in various embodiments.

As shown in FIG. 2, one or more DRAM dies and one or more PCMS dies are stacked on top of an SOC (System On Chip) or CPU die. The dies may be interconnected using Through Silicon Vias (TSVs) to provide a very large number of very short electrical connections. The data rate on these interconnects may be quite high and the capacitance of the interconnects may be quite low. This combination delivers very high bandwidth at very low power.

The PCMS devices in the stack are used to temporarily store copies of the state data set in low cost bits that may retain the data at virtually zero power since the data bits do not need to be refreshed like DRAM bits. The PCMS devices may also be used to save the state data sets of adjacent CPU/memory nodes to provide a distributed check pointing resource. This approach will be beneficial if a whole node fails but is more costly in terms of latency, foot print, etc. In an embodiment, checkpointing may be performed in a hierarchical fashion to periodically move data from one rack to another (or from a closer/local PCMS die to other PCMS nodes/devices).

The PCMS devices may be located on the data path interconnect between the CPU and the DRAM devices. The CPU to DRAM data path is typically very high bandwidth to deliver the bandwidth required for High Performance Computing (HPC). By placing the PCMS devices on this same interconnect, the amount of time to move the data from the DRAM to the PCMS memory may be minimized thus improving the computational efficiency of the machine. The short interconnect length also allows the data to be transferred at very low power which is very important in a machine with hundreds of thousands of nodes.[Label1]

An embodiment solves the checkpointing performance/power problem by using PCMS memory to quickly store the state data set in a cost effective way and allow the data to migrate to adjacent nodes or the backup media (e.g., other (cheaper or higher capacity) non-volatile memory (such as those discussed with reference to FIG. 4 or 5) including for example hard disk drives, network attached storage (NAS), e.g., as a background process. Accordingly, the unique latency and bandwidth characteristics of PCMS devices enable this local checkpointing architecture.

In one embodiment, the use of a common data bus between the CPU, DRAM, and PCMS devices enables time and/or power efficient direct DRAM to PCMS data transfers. In an embodiment, the physical placement of the PCMS die between the CPU die and the DRAM die enables the DRAM die temperature to be held significantly lower than the CPU die temperature. Moreover, because the DRAM die(s) are generally located closest to the thermal solution and the CPU die is located farthest away, the PCMS die would act like an insulation layer that allows the DRAM die temperature to be held significantly lower than the CPU die temperature. Keeping the DRAM cool reduces the current leakage in the DRAM bit cells which allows the DRAM refresh period to be extended; thus reducing power consumption. The efficiency of the PCMS die is also enhanced by elevating the temperature of the PCMS cells thus requiring less power to achieve the temperatures used to write data to the PCMS cells. In an alternate embodiment, the DRAM is placed between the CPU and the PCMS devices so that the electrical connection between the DRAM and PCMS devices can be isolated to reduce the capacitive loading on the DRAM to CPU interconnect. This alternative configuration would result in lower power consumption for transferring data between the CPU and DRAM.

As discussed above, current systems do not use local non-volatile storage for check pointing. Current systems transfer the DRAM data through several devices between the DRAM die and the backup storage media thus wasting power. Also, current systems do not create a snapshot of the state data set and then gradually transfer the data to the backup media.

Figure 3:
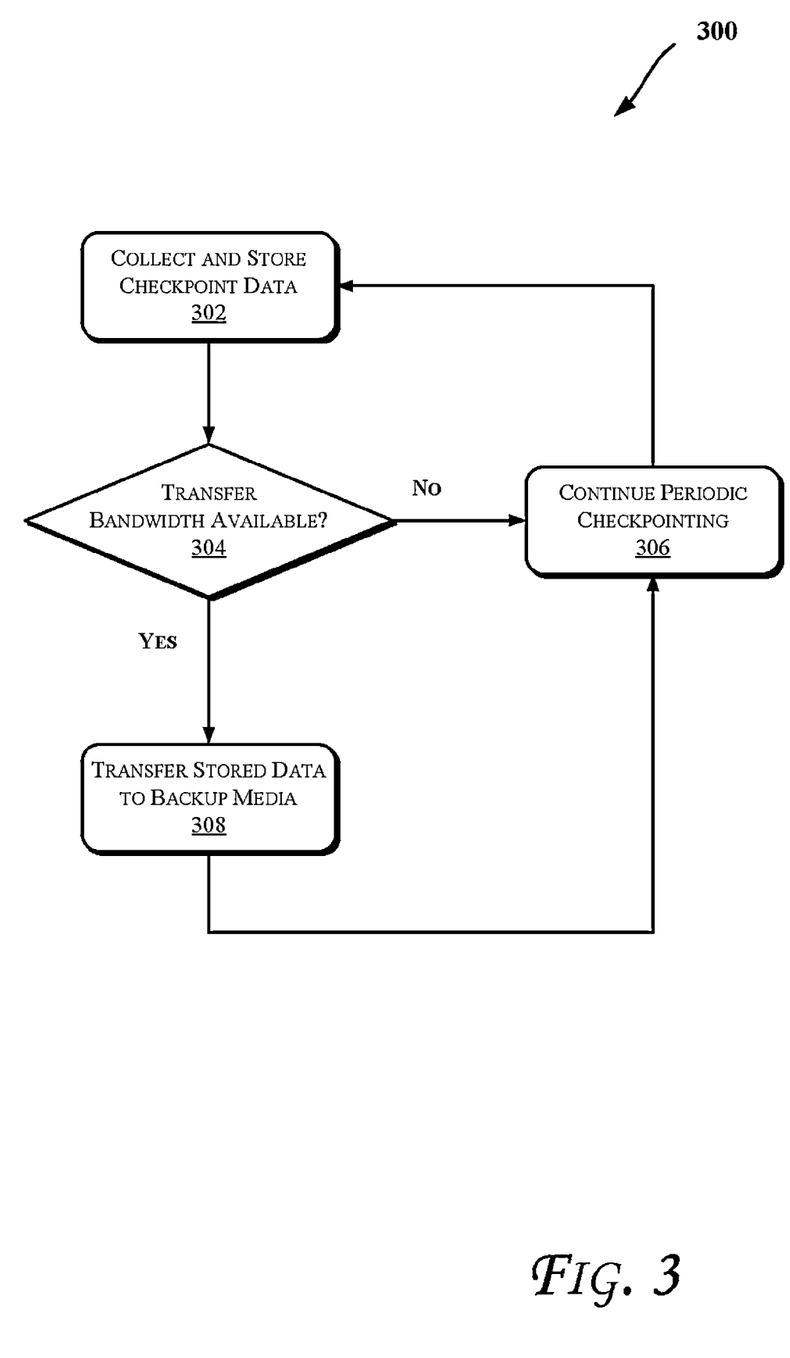
FIG. 3 illustrates a flow diagram of a method in accordance with an embodiment of the invention.

FIG. 3 illustrates a flow diagram of a method 300 to implementation a decision tree used to switch to different trim profiles, in accordance with an embodiment of the invention. In an embodiment, various components discussed with reference to FIGS. 1-3 and 4-5 may be utilized to perform one or more of the operations discussed with reference to FIG. 3.

Referring to FIGS. 1-3, at an operation 302, CPU checkpointing state data is collected and stored (e.g., in the DRAM die 202 and then from the DRAM die 202 to the PCMS die 204 or alternatively directly to the PCMS die 204). In an embodiment, operation 302 may be done periodically (e.g., based on a timer expiration which may be configurable in response to application type, per user input, etc.). At an operation 304, it may be determined (e.g., by the logic 125) whether data transfer bandwidth is available on the interconnect/bus that couples the PCMS die (e.g., via interface(s) 208) to back up media. If no bandwidth is available, an operation 306 may continue period checkpointing (which may sometimes override older checkpointing data if no additional space is available in the PCMS die for the new checkpointing data). In some embodiments, a decision tree would periodically perform a checkpoint and slowly transfer the data as bandwidth becomes available until the complete set of state data is transferred.

At operation 304, if transfer bandwidth is available, then an operation 308 (e.g., by the logic 125) may transfer the state data to backup media as discussed herein. In some embodiments, the state data may be compressed (e.g., prior to storing it in the DRAM, prior to storing it in the PCMS, prior to storing it in the backup media, prior to storing it in one or more remote nodes, etc.). The compressed data may then be uncompressed prior to restoration, e.g., due to a failure.

Figure 4:
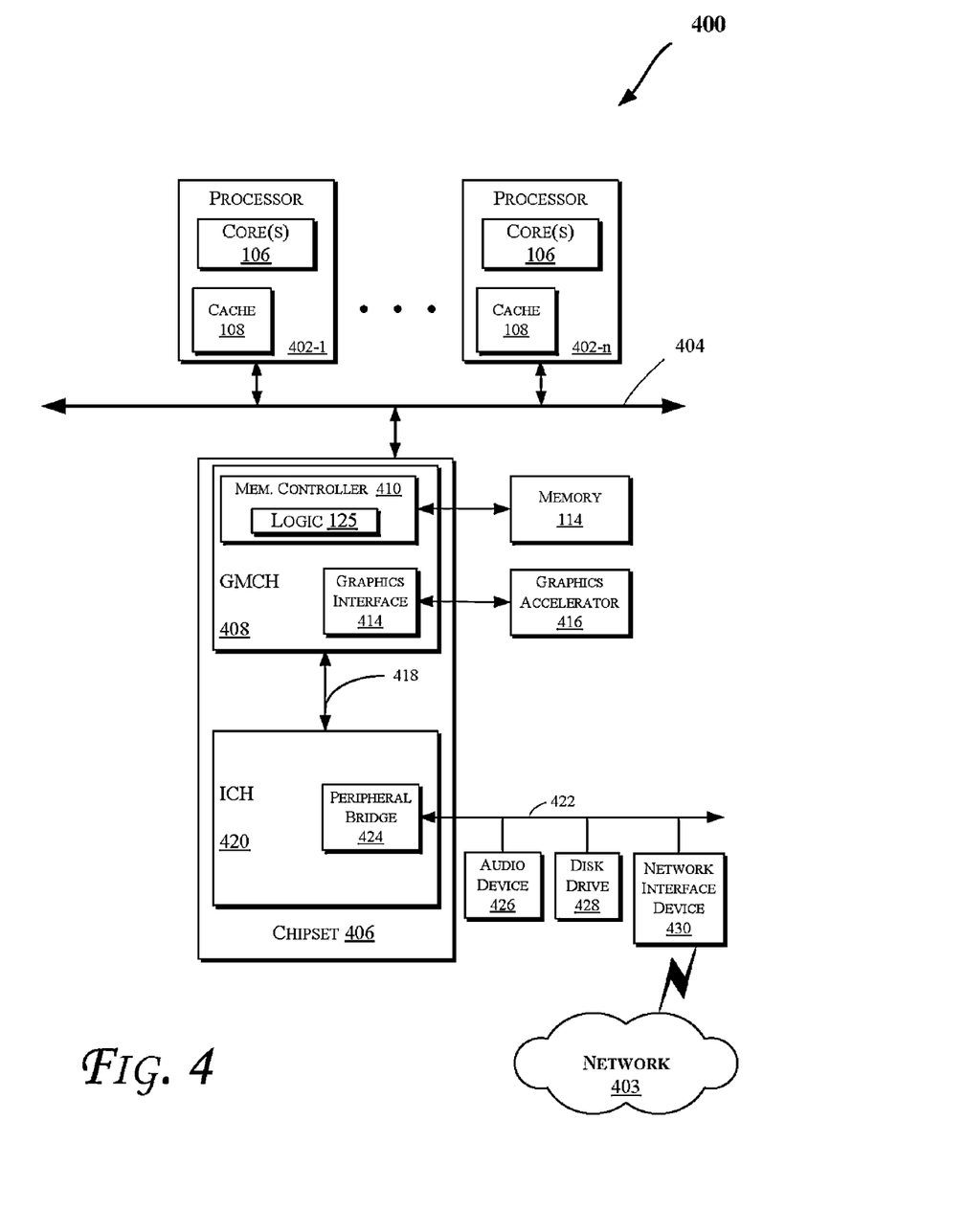

FIG. 4 illustrates a block diagram of a computing system 400 in accordance with an embodiment of the invention. The computing system 400 may include one or more central processing unit(s) (CPUs) 402 or processors that communicate via an interconnection network (or bus) 404. The processors 402 may include a general purpose processor, a network processor (that processes data communicated over a computer network 403), an application processor (such as those used in cell phones, smart phones, etc.), or other types of a processor (including a reduced instruction set computer (RISC) processor or a complex instruction set computer (CISC)). Various types of computer networks 403 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 4G, Low Power Embedded (LPE), etc.). Moreover, the processors 402 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors.

In an embodiment, one or more of the processors 402 may be the same or similar to the processors 102 of FIG. 1. For example, one or more of the processors 402 may include one or more of the cores 106 and/or cache 108. Also, the operations discussed with reference to FIGS. 1-3 may be performed by one or more components of the system 400.

A chipset 406 may also communicate with the interconnection network 404. The chipset 406 may include a graphics and memory control hub (GMCH) 408. The GMCH 408 may include a memory controller 410 (which may be the same or similar to the memory controller 120 of FIG. 1 in an embodiment, e.g., including the logic 125) that communicates with the memory 114. The memory 114 may store data, including sequences of instructions that are executed by the CPU 402, or any other device included in the computing system 400. In one embodiment of the invention, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 404, such as multiple CPUs and/or multiple system memories.

The GMCH 408 may also include a graphics interface 414 that communicates with a graphics accelerator 416. In one embodiment of the invention, the graphics interface 414 may communicate with the graphics accelerator 416 via an accelerated graphics port (AGP). In an embodiment of the invention, a display (such as a flat panel display) may communicate with the graphics interface 414 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display.

A hub interface 418 may allow the GMCH 408 and an input/output control hub (ICH) 420 to communicate. The ICH 420 may provide an interface to I/O devices that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 420, e.g., through multiple bridges or controllers. Moreover, other peripherals in communication with the ICH 420 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403). Other devices may communicate via the bus 422. Also, various components (such as the network interface device 430) may communicate with the GMCH 408 in some embodiments of the invention. In addition, the processor 402 and the GMCH 408 may be combined to form a single chip. Furthermore, the graphics accelerator 416 may be included within the GMCH 408 in other embodiments of the invention.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 5:
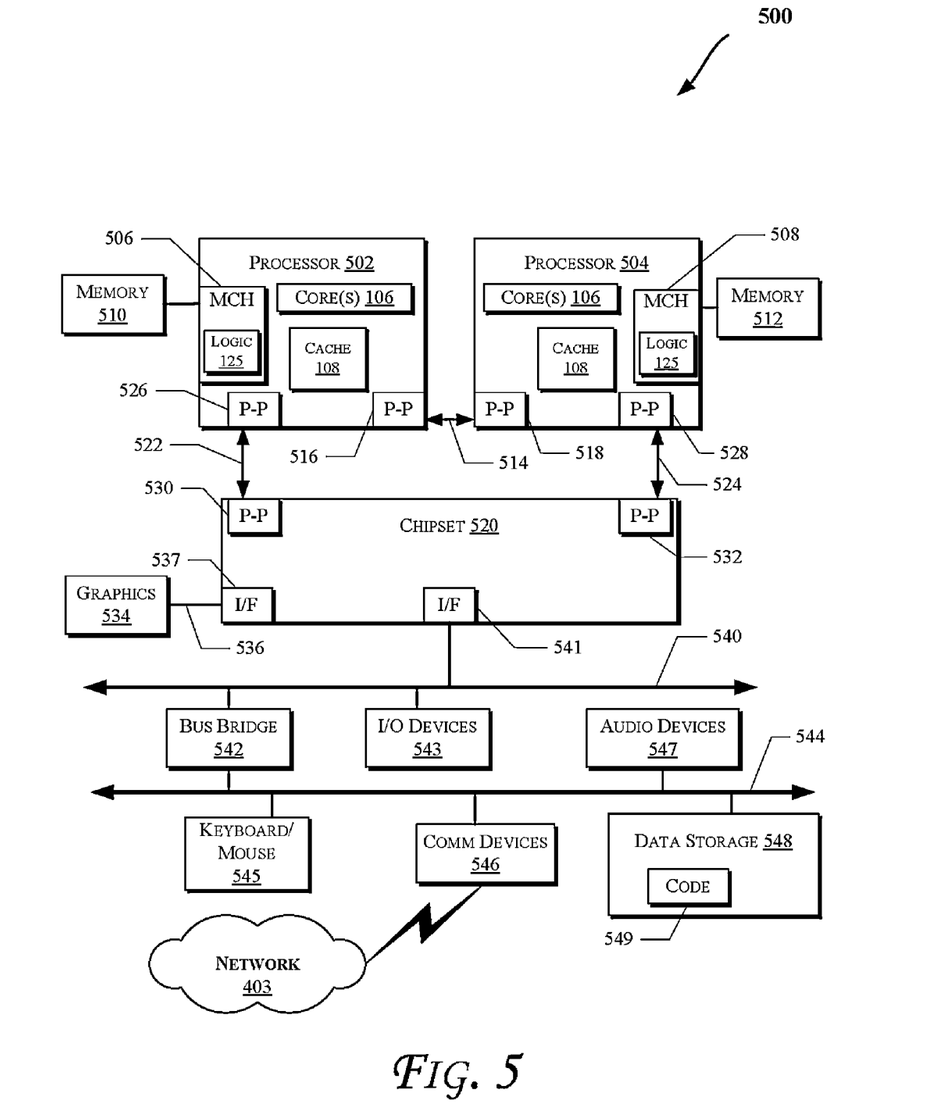

FIG. 5 illustrates a computing system 500 that is arranged in a point-to-point (PtP) configuration, according to an embodiment of the invention. In particular, FIG. 5 shows a system where processors, memory, and input/output devices are interconnected by a number of point-to-point interfaces. The operations discussed with reference to FIGS. 1-4 may be performed by one or more components of the system 500.

As illustrated in FIG. 5, the system 500 may include several processors, of which only two, processors 502 and 504 are shown for clarity. The processors 502 and 504 may each include a local memory controller hub (MCH) 506 and 508 to enable communication with memories 510 and 512. The memories 510 and/or 512 may store various data such as those discussed with reference to the memory 114 of FIGS. 1 and/or 4. Also, MCH 506 and 508 may include the memory controller 120 and/or logic 125 of FIG. 1 in some embodiments.

In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Also, the processors 502 and 504 may each exchange data with a chipset 520 via individual PtP interfaces 522 and 524 using point-to-point interface circuits 526, 528, 530, and 532. The chipset 520 may further exchange data with a high-performance graphics circuit 534 via a high-performance graphics interface 536, e.g., using a PtP interface circuit 537.

As shown in FIG. 5, one or more of the cores 106 and/or cache 108 of FIG. 1 may be located within the processors 502 and 504. Other embodiments of the invention, however, may exist in other circuits, logic units, or devices within the system 500 of FIG. 5. Furthermore, other embodiments of the invention may be distributed throughout several circuits, logic units, or devices illustrated in FIG. 5.

The chipset 520 may communicate with a bus 540 using a PtP interface circuit 541. The bus 540 may have one or more devices that communicate with it, such as a bus bridge 542 and I/O devices 543. Via a bus 544, the bus bridge 543 may communicate with other devices such as a keyboard/mouse 545, communication devices 546 (such as modems, network interface devices, or other communication devices that may communicate with the computer network 403), audio I/O device, and/or a data storage device 548. The data storage device 548 may store code 549 that may be executed by the processors 502 and/or 504.

In various embodiments of the invention, the operations discussed herein, e.g., with reference to FIGS. 1-5, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-5.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An integrated circuit device comprising:
   a Non-Volatile Memory (NVM) die coupled to a Dynamic Random Access Memory (DRAM) die and a Central Processing Unit (CPU) die;
   wherein CPU checkpointing state data is to be stored in the NVM die during a first time period and the CPU checkpointing state data stored in the NVM die is to be transferred to a backup media during a second time period,
   wherein the second time period follows the first time period and the second time period is longer than the first time period, wherein a physical placement of the NVM die between the CPU die and the DRAM die enables the DRAM die temperature to be held significantly lower than the CPU die temperature, wherein logic is to cause the CPU checkpointing state data to be transferred from the NVM die to the backup media as data transfer bandwidth on an interconnect, coupled between the NVM die and the backup media, becomes available until a complete set of state data is transferred, wherein checkpointing operations are to be performed in a hierarchical fashion to periodically move data from one memory rack to another memory rack, wherein each of the memory racks is to comprise one or more NVM dies.

2. The device of claim 1, wherein one or more of the NVM, DRAM, and CPU dies are to be interconnected by Through Silicon Vias (TSVs).

3. The device of claim 1, wherein the NVM die is to store state data sets of adjacent CPU or memory nodes to provide a distributed check pointing resource.

4. The device of claim 1, wherein the NVM die is to be located on a data path interconnect between the CPU die and the DRAM die.

5. The device of claim 1, wherein the NVM die is to thermally insulate the DRAM die and the CPU die.

6. The device of claim 1, wherein the NVM die is electrically isolated from the interconnect between the DRAM die and the CPU die.

7. The device of claim 1, wherein the CPU die is to execute instructions to continue work on a problem during the second time period.

8. The device of claim 1, wherein the backup media is to comprise one or more of hard disk drive, magneto-optical disk drive, flash memory, or network attached storage.

9. The device of claim 1, further comprising a plurality of NVM dies.

10. The device of claim 1, further comprising a plurality of DRAM dies.

11. The device of claim 1, further comprising a plurality of CPU dies.

12. The device of claim 1, further comprising an interface to facilitate communication between the integrated circuit device and one or more computing system components.

13. The device of claim 12, wherein the interface comprises an optical interface.

14. The device of claim 1, wherein the CPU die is to comprise a plurality of processor cores.

15. The device of claim 1, further comprising NVM controller logic to issue read or write requests to the NVM die.

16. The device of claim 1, wherein the NVM die is stacked on top of a System On Chip (SOC) die.

17. The device of claim 1, wherein older checkpointing state data is to be overwritten if additional space is unavailable in the NVM die.

18. The integrated circuit device of claim 1, wherein the interconnect is to comprise an optical interface.

19. A method comprising:
storing CPU checkpointing state data in NVM die, coupled to a DRAM die and a CPU die, during a first time period; and
transferring the CPU checkpointing state data stored in the NVM die to a backup media during a second time period,
wherein the second time period follows the first time period and the second time period is longer than the first time period, wherein a physical placement of the NVM die between the CPU die and the DRAM die enables the DRAM die temperature to be held significantly lower than the CPU die temperature, wherein the CPU checkpointing state data is transferred from the NVM die to the backup media as data transfer bandwidth on an interconnect, coupled between the NVM die and the backup media, becomes available until a complete set of state data is transferred, wherein checkpointing operations are to be performed in a hierarchical fashion to periodically move data from one memory rack to another memory rack, wherein each of the memory racks comprises one or more NVM dies.

20. The method of claim 19, further comprising compressing the CPU checkpointing state data.

21. The method of claim 19, wherein one or more of the NVM, DRAM, and CPU dies are interconnected by Through Silicon Vias (TSVs).

22. The method of claim 19, further comprising the NVM die storing state data sets of adjacent CPU or memory nodes to provide a distributed check pointing resource.

23. A system comprising:
a CPU die having a plurality of processor cores;
an NVM die coupled to a DRAM die and the CPU die;
wherein CPU checkpointing state data is to be stored in the NVM die during a first time period and the CPU checkpointing state data stored in the NVM die is to be transferred to a backup media during a second time period,
wherein the second time period follows the first time period and the second time period is longer than the first time period, wherein a physical placement of the NVM die between the CPU die and the DRAM die enables the DRAM die temperature to be held significantly lower than the CPU die temperature, wherein logic is to cause the CPU checkpointing state data to be transferred from the NVM die to the backup media as data transfer bandwidth on an interconnect, coupled between the NVM die and the backup media, becomes available until a complete set of state data is transferred, wherein checkpointing operations are to be performed in a hierarchical fashion to periodically move data from one memory rack to another memory rack, wherein each of the memory racks is to comprise one or more NVM dies.

24. The system of claim 23, wherein one or more of the NVM, DRAM, and CPU dies are to be interconnected by Through Silicon Vias (TSVs).

25. The system of claim 23, wherein the NVM die is to store state data sets of adjacent CPU or memory nodes to provide a distributed check pointing resource.

26. The system of claim 23, wherein the NVM die is to be located on a data path interconnect between the CPU die and the DRAM die.

27. The system of claim 23, further comprising an audio device.

* * * * *